(12) United States Patent
Dubey

(10) Patent No.: US 6,470,475 B2
(45) Date of Patent: Oct. 22, 2002

(54) SYNTHESIZABLE SYNCHRONOUS STATIC RAM

(75) Inventor: Prashant Dubey, Uttar Pradesh (IN)

(73) Assignee: STMicroelectronics Ltd., Uttar Pradesh (IN)

( * ) Notice: Subject to any disclaimer, the term of this patent is extended or adjusted under 35 U.S.C. 154(b) by 0 days.

(21) Appl. No.: 09/988,882

(22) Filed: Nov. 20, 2001

(65) Prior Publication Data

US 2002/0110042 A1 Aug. 15, 2002

(30) Foreign Application Priority Data

Nov. 23, 2000 (IN) .................................. 1050/DEL/2000

(51) Int. Cl.⁷ .............................................. G06F 17/50
(52) U.S. Cl. .................................. 716/1; 716/4; 716/18
(58) Field of Search .................. 716/1, 4, 18

(56) References Cited

U.S. PATENT DOCUMENTS

| | | | | |
|---|---|---|---|---|
| 5,867,399 A | * | 2/1999 | Rostoker et al. | 716/18 |
| 5,963,454 A | * | 10/1999 | Dockser et al. | 716/18 |
| 6,295,627 B1 | * | 9/2001 | Gowni et al. | 716/1 |

* cited by examiner

*Primary Examiner*—Trong Phan
(74) *Attorney, Agent, or Firm*—Lisa K. Jorgenson; Allen, Dyer, Doppelt, Milbrath & Gilchrist, P.A.

(57) ABSTRACT

A synthesizable, synchronous static RAM may include custom built memory cells and a semi-custom input/output/precharge section in bit slice form, a semi-custom built decoder connected to the bit slice, and a semi-custom built control clock generation section connected to the semi-custom built decoder and input/output section. The components may be arranged to provide high speed access, easy testability, and asynchronous initialization capabilities while reducing design time, and in a size that is significantly smaller than existing semi-custom or standard cell based memory designs.

36 Claims, 3 Drawing Sheets

SYNTHESIZABLE SYNCHRONOUS STATIC RAM

FIELD OF THE INVENTION

This invention relates to the field of electronic circuits, and, more particularly, to a synthesizable, synchronous static random access memory (RAM) for use in application specific integrated circuits (ASICs).

BACKGROUND OF THE INVENTION

The complexity of ASIC chips is continually increasing. Most ASICs include built-in memory. One memory commonly used on ASICs and system on chips (SOCs) is static random access memory (SRAM). There are two types of SRAMs commonly in use, namely synchronous and asynchronous SRAMs. The operations inside the asynchronous memories are not synchronized to a clock, while in synchronous memories all operations are synchronized to a clock signal. The SRAMs used in ASICs are typically optimized for high speed, low power, and small areas and are synchronous in nature.

A typical prior art synchronous SRAM may include a data input port, an address port, a clock port, a memory select port, an output enable port, a write enable port, and an output port. See, e.g., Handy, Jim, "The Cache Memory Book", Academic Press, Inc., Harcourt Brace & Company. The structure of one such synchronous prior art SRAM is illustrated in FIG. 1, which includes a decoder section 1.1, a core section 1.2, an input/output (IO) section 1.3, control and clock generation circuits 1.4, and dummy paths (not shown).

The above listed blocks or elements are made in the form of bit slice cells that are abutted to form a memory block of a desired word of x-bit configuration. Development of the memory may include making these cells in a particular technology and "tuning" them according to the full range of words and bits required. Typically a critical path is used for scheduling various operations, which are triggered by the positive edge of the external clock. This critical path may be characterized on CAD tools to tune the memory for different shapes and sizes. See, e.g., Weste Neil H. E., Eshraighian Kamran, "Principles of CMOS VLSI Design: Systems Perspective".

There are also self-timing structures which use a dummy path along the core and are triggered at the positive edge of the internal clocks (generated by the clock generation circuits). Such structures are used to switch off the sense amps and initialize pre-charging at a suitable time (after the read/write operation has ended). See Handy, above. This saves power consumption and decreases the cycle time of the memory.

Current designs of such memories have several drawbacks. First, the memory cells are full custom blocks that do not follow standard cell design rules and hence cannot be used along with the standard cells. They are, therefore, treated as "hard core" macros for which separate planning has to be done in the layout process, which may require a considerable amount of time for certain technologies. Furthermore, the testability is poor as the standard design for testability (DFT) tools treat these custom cells as "black boxes" and hence do not model internal structure.

Another drawback may be the fact that such memories may not have an asynchronous reset facility and therefore require a long time for initialization. Additionally, these memories are typically routed in more than three metal layers. Thus, over-the-block routing in metal in higher levels is not possible. Also, the front end models in hardware-description language HDL's are based upon the custom designs, and thus the method of operation of the memory may not be clear to the user. This can make debugging of such memories difficult.

SUMMARY OF THE INVENTION

An object of the invention is to alleviate the above drawbacks by providing a synthesizable synchronous static RAM using a combination of custom and semi-custom blocks.

Another object of the invention is to improve the access of an synchronous static RAM.

Yet another object of the invention is to provide relatively easy testability.

Still another object of the invention is to provide asynchronous initialization.

A further object of the invention is to provide memory modeling at the RTL level.

Yet another object of the invention is to enable automatic layout and thereby reduce design time.

To achieve the above objectives, the invention provides a synthesizable, synchronous static RAM which may include custom-built memory cells and a semi-custom input/output/precharge section in bit slice form, a semi-custom built decoder connected to the bit slice, and a semi-custom built control clock generation section. The control clock generation section may be connected to the semi-custom built decoder and I/O section. Further, the arrangement of the above components may provide high speed access, easy testability and asynchronous initialization capabilities while reducing design time, and in a size that is significantly smaller than existing semi-custom or standard cell-based memory design.

The custom-built memory cells in bit slice may be compatible with semi-custom synthesis tools and standard cell layout design rules for simulation and automatic layout to thereby reduce design time. The memory cell and input/output/precharge section in the bit slice may include a single column of memory cells connected to common bit lines. The semi-custom decoder may include flip-flops at its output for reducing occurrences of glitches reaching the custom-built memory cells. The flip-flops may be driven by clock tree signals to reduce clock skew and address setup time to thereby improve operational speed.

The decoder may be a fully synthesizable block for which an RTL is available. Further, the semi-custom decoder may include buffers to improve the speed of access. Also, the custom built memory cells, semi-custom decoder, input/output section and semi-custom clock generation circuitry may be collectively and individually testable using register transfer level (RTL) models for each unit.

In addition, the flip-flops may be provided with a common asynchronous preset/clear input to enable simultaneous selection of all word lines and thereby all memory locations for writing common initialization values (i.e., the value at the data input port) at all memory locations. The asynchronous preset/clear signal may also be used to provide asynchronous resetting. Also, the flip-flops can be used to select multiple word lines simultaneously, thus providing a synchronous initialization through scan inputs. Other inputs may be used to provide a checker board test pattern initialization. The RTL code may be mapped over any technology library, whether high speed, low power, low leakage, etc. Further, the decoder may be tested using automatically generated test patterns via the scan input.

BRIEF DESCRIPTION OF THE DRAWINGS

The invention will now be explained with reference to the following drawings.

DETAILED DESCRIPTION OF THE PREFERRED EMBODIMENTS

Figure 1:
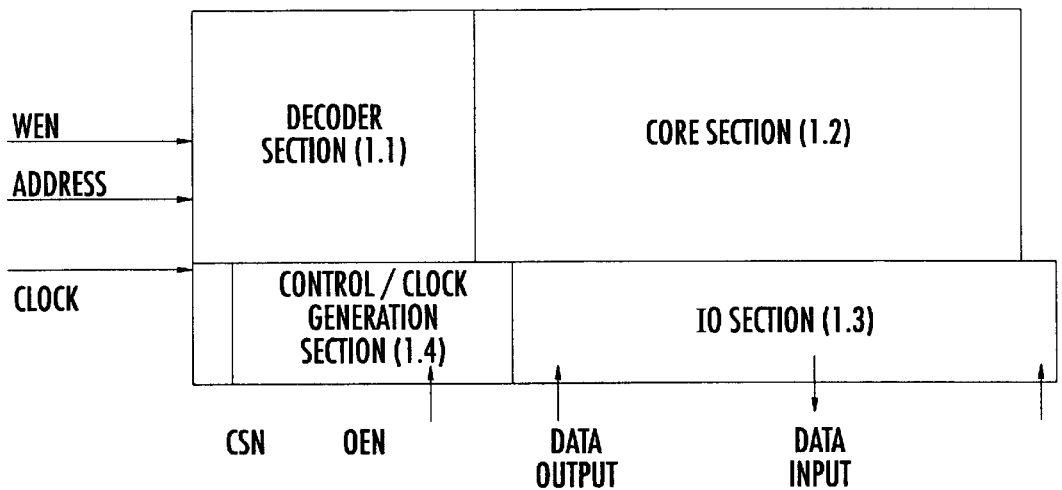
FIG. 1 is a schematic block diagram of a typical single port SRAM according to the prior art.
Figure 2:
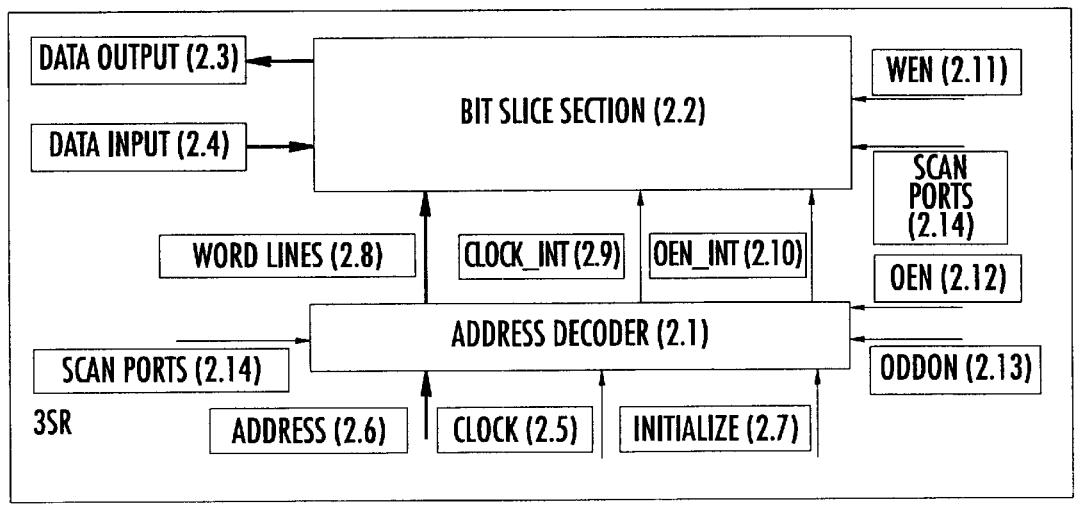
FIG. 2 is a schematic block diagram of the architecture of a synthesizable synchronous static RAM according to the invention.

Turning now to FIG. 2, an SRAM according to the present invention which may overcome the above noted disadvantages of full custom prior art SRAMs will now be described. The memory cells are a full, custom design and organized as an array of bit slice sections 2.2. An address decoder 2.1 receives address signals 2.6 and a clock signal 2.5 from external devices and generates signals on word lines 2.8, clock-int 2.9 and OEN-int 2.10 to access the required memory cell bit slice section 2.2. Data input output circuits 2.4, 2.3 are connected to external devices to provide the data connection to the accessed memory cell bit slice section 2.2. The inputs WEN 2.11 and OEN 2.12 are similarly connected to signals from external devices during write and read operations, respectively. A signal INITIALIZE 2.7 is an external signal used to initialize contents of the bit slice section 2.2, and an input ODDON 2.13 may be used for the special case of writing a "checkerboard" test pattern in the bit slice section. Further, the signals SCANPORTS 2.14 are standard scan chain test signals.

The address decoder 2.1 is a semi-custom built, fully-synthesizable block for which an RTL code is written. The user can map the RTL code for the memory decoder in a technology library, such as high speed, low leakage, low power, etc. The custom-built memory cell and a semi-custom IO precharge section in bit slice 2.2, the semi-custom address decoder 2.1, IO section including the data input 2.3 and the data output 2.4, and the semi-custom clock generation circuitry 2.5 are collectively and individually testable using RTL models for each unit. Further, this RTL code is compatible with DFT insertion tools.

Figure 3:
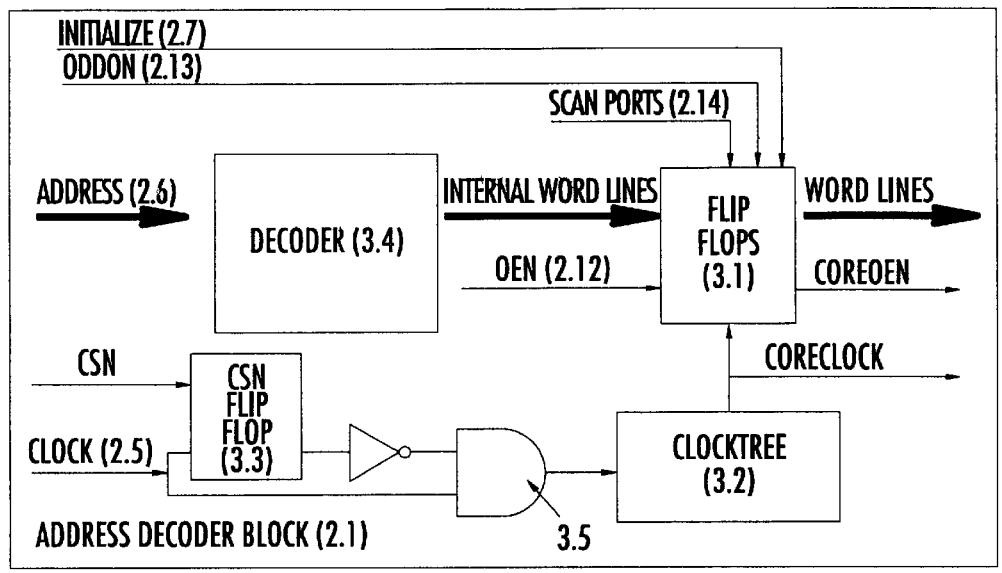
FIG. 3 is a schematic block diagram of the architecture of the address decoder block of FIG. 2.

Referring to FIG. 3, the internal structure of the semi-custom built address decoder 2.1 is illustratively shown. The address decoder 2.1 decodes the address at the address ports 2.6 irrespective of the clock edge. The word lines generated at the output of a decoder 3.4 are latched into flip-flops 3.1 at the positive edge of the clock. This prevents glitches arising at the output of the decoder 3.4 from reaching the custom-built memory cells 2.2 (FIG. 2).

The semi-custom built address decoder 2.1 includes buffers (not shown) to increase the speed of access. The flip-flops 3.1 are provided with inputs INITIALIZE 2.7 and ODDON 2.13 which control the asynchronous preset/clear inputs of the flip-flops. This is to enable simultaneous selection of all word lines or alternate word lines, respectively, and thereby implement writing of a common initialization value at all or alternate memory locations. This arrangement may be used to provide an asynchronous reset function.

The clock 2.5 coming from the external devices is ANDed (by an AND gate 3.5) with the output of a CSN flip-flop 3.3 to reduce the power consumption when the memory has not been selected. A clock tree 3.2 is implemented for connecting the clock to all the flip-flops 3.1 to reduce the clock skew. This clock tree also takes care of the clock slope at all the flip-flop inputs. The clock tree feature is optional. Although the clock tree introduces some insertion delay in the clock path, which in turn adds to the access time of the memory, it simultaneously reduces the address setup time. When the clock goes negative, the word lines are deselected. For dual port or multiport SRAMs, similar decoder architecture can be used for different ports.

Figure 4:
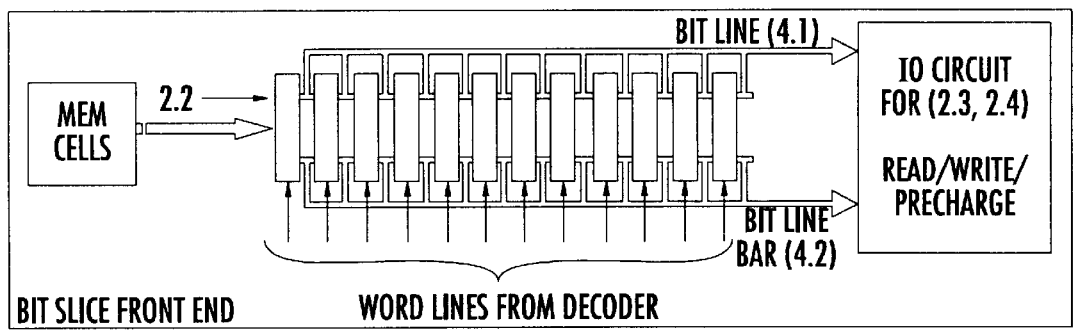
FIG. 4 is a schematic block diagram of the front end structural model of the SRAM of FIG. 2.

The internal arrangement of the memory cells 2.2 in bit slice form is shown in FIG. 4. Each bit slice is a custom built single column of memory. It has two parts, namely the core and IO. The core includes the memory cells 2.2, and the IO (i.e., the data input 2.3 and data output 2.4) includes the circuitry for writing/reading data to/from a memory cell upon selection by the respective word line, as well as for precharging the bit lines.

The memory cells in the bit slice 2.2 are a single column of memory cells and are connected to a common bit line 4.1 and common bit line bar 4.2. The individual memory cells are abutted to form a single variable bit custom cell. Each memory cell in bit slice form is connected to one of the word lines coming from the address decoder 2.1. The common bit line signal is finally connected to write and read circuitry (i.e., the data input 2.3 and data output 2.4), which is made-up of standard cells like flip-flops, NAND gates, NOR gates, latches, tristate buffers, logic buffers, logic inverters, pull-ups, etc. Thus, a full structural model of a bit slice is given in the front end in which all the gates involved have clear functionality. As a result, they do not become a "black box" for testability tools. The same approach be used to derive the front-end models for the dual port and multiport memories. The memory cells do not use flip-flops, as in existing designs of semi-custom/standard cell memory cells, and are therefore much smaller in size.

Figure 5:
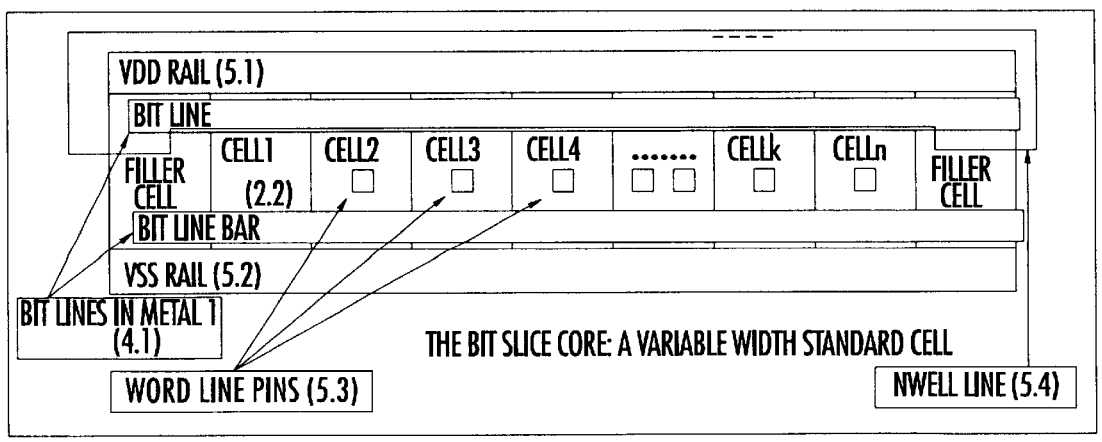
FIG. 5 is a schematic block diagram of the layout architecture of the bit slice core of the bit slice section of FIG. 4.

The physical layout of the memory cells in bit slice form is shown in FIG. 5. The layouts of the custom built memory cells and the gates in the IO circuitry of a single bit slice are abutted in such a way that they form a single variable-width (depending upon the number of cells in one column) standard cell with the bit lines 4.1 running in metal layer 1 over the memory cells 2.2. The custom built memory cells in bit slice form 2.2 are compatible with standard semi-custom simulation and synthesis tools to enable automatic layout, thereby reducing design time. The height of each cell is equal to the height of the standard cell. The power lines VDD 5.1 and VSS 5.2 are put in a metal layer so that they can be connected directly to the standard cell power rail without a metal via or filler cell.

To make a concise layout of the memory cell, the use of the line NWELL 5.4 and other standards for a standard cell are deviated from somewhat in that a filler cell is put at the end and the beginning of the bit slice core. Similar architectures can be made for dual port and multiport SRAM bit slices. Therefore, the bit slice is similar to a standard cell for layout purposes, and can be used along with other standard cells.

The bit lines have been kept in a lower metal layer than the word lines 5.3 to shield them against external signals.

The user can run any signal in the metal layer 2, but it should preferably be in a perpendicular direction to the bit line direction to decrease the coupling. The bit slice IO and the bit slice CORE are kept abutted by the Unix shell routines in the place and route tool environment.

The extraction of the bit line and word line capacitance is performed and the delay calculated may then be back annotated into the memory cell's front-end model in Verilog or other hardware description languages. See, e.g., Ku, David C., Micheli, Giovanni De, "High Level Synthesis of ASICs Under Timing and Synchronization Constraints", Kluwer Academic Publishers. A point to be noted here is that the memory cell in itself is a full entity which includes its own front end model and back end layout and is defined as an integrated unit to provide bit line protection and also to achieve good access time. See, e.g., Michel Petra, Lauther Ulrich, Peter Duzy, "The Synthesis Approach to Digital System Design", Kluwer Academic Publishers. Thus, it reduces limitations at the user end, and a routable core is achieved through this approach.

The memory characterization methodology accounts for the bit line discharge rate for the maximum range, the write margin, and the memory cell stability (static noise margin SNM figure is calculated). Further, a full Monte Carlo analysis may be done to check the robustness of the full bit slice to avoid any silicon failure, and the leakage in the bit slice core is calculated. Also, to achieve a good access time and also to take care of any setup/hold violation, a constraint file is given along with the memory block to the user. This constraint file is used during the place and route of the memory.

The address decoder is synthesized and a full scan insertion is done to make it testable. See., e.g., Petra et al., above; Goor Vande, A. J., "Testing Semiconductor Memories—Theory and Practice", John Wiley & Sons Ltd. Thus, all the decoder faults can be detected through automatic test program generation (ATPG) techniques. Besides the implementation of a testable decoder, the scan flip-flops at the word lines can be used to select more than one word line at a time (irrespective of the address at the address port). Thus, a desired pattern can be written in to the memory faster (decoding time is saved) and also in fewer clock cycles.

The full memory can also be initialized through the inputs INITIALIZE and ODDON. The input INITIALIZE also implements a synchronous power on reset (although an asynchronous reset is also possible by using the flip-flops clear or preset pins directly) by selecting all the word lines in a single clock cycle. Similarly, when the input INITIALIZE is inactive and the clock posedge comes, the data word at the data port of the bit slice is written to all the odd/even addresses, depending upon whether the ODDON pin is at logic 1 or 0. Thus, in only two clock cycles one can create a checkerboard pattern inside the memory.

Other patterns can also be written into the memory in the same way. This helps in detecting the pattern sensitive faults (PSF) in the memory. The advantage of this approach is that it takes fewer clock cycles to get the full coverage of the PSF's in the memory core. According to the Goor Vande reference noted above, faults such as coupling and toggle faults are a subset of the PSF's. Hence, nearly all the faults in a memory are covered through this approach. During the test mode (scan automatic test pattern generation ATPG mode), the clock to all the flip-flops is the external signal CLOCK to avoid any scan design rule violation.

Figure 6A:
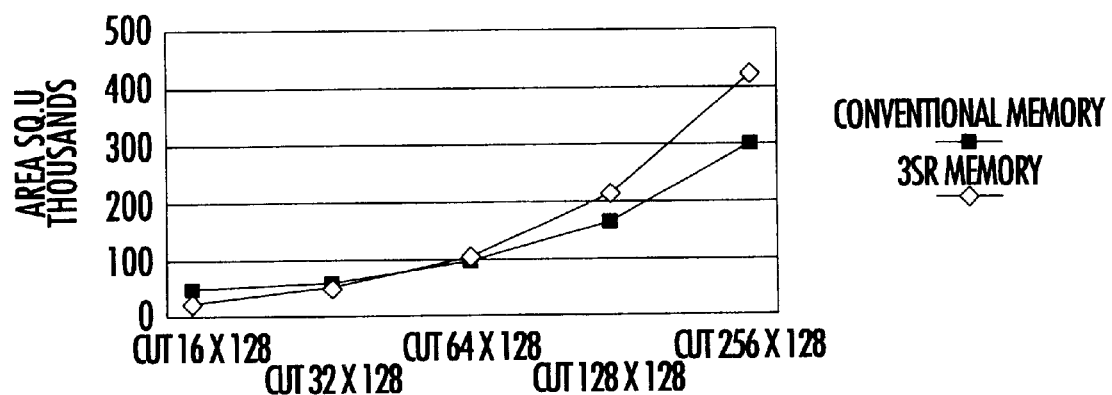
FIGS. 6A and 6B are graphs illustrating area comparison between a typical prior art memory and the 3SR RAM according to the invention.
Figure 6B:
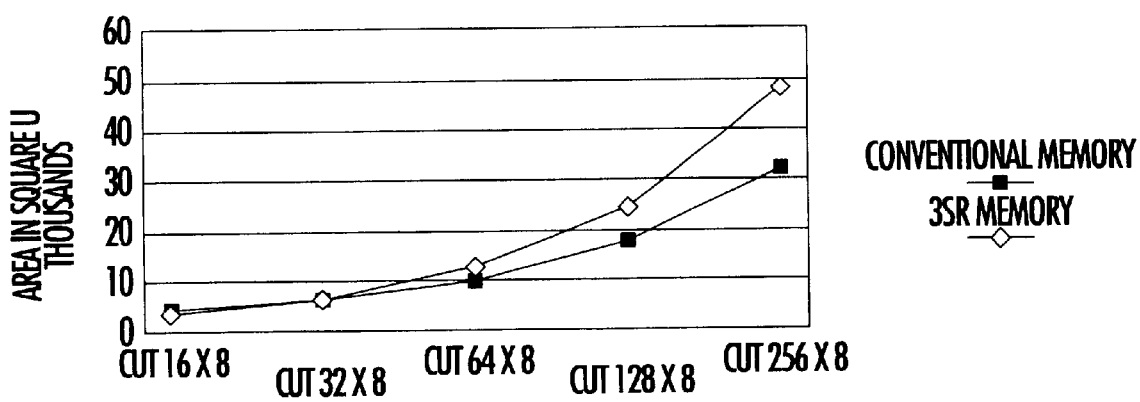

Size comparisons between conventional full-custom memories and the self-sustained sequence replication 3SR architecture are illustrated in FIGS. 6A and 6B. As shown, the 3SR architecture shows an advantage for smaller configurations. In larger configurations, the size penalty is only a maximum of 40%, which is significantly less than for existing designs using semi-custom standard memory cells.

Those of skill in the art will appreciate the following advantages of the invention. First, there may be a reduction in time to market. Additionally, all blocks can be built using standard semi-custom DFT tools, and all blocks can also be placed and routed using standard automatic semi-custom layout tools. Further, the layout density is improved as the design supports routing over the memory cell block. There is also an option of using high speed/low leakage cells. Additionally, the memory modeling is done at the RTL level and not at the operational level, which makes understanding the internal operations relatively easy. Hence, the debugging may also be relatively easy.

Moreover, another advantage of the present invention is that asynchronous initialization (including RESET) option is available, which facilitates rapid memory initialization. Further, both synchronous and asynchronous initialization with any desired data in all locations, as well as checkerboard pattern initialization, are possible for testing. In addition, the cell in the bit slice can be an 8/6/4/2/1 transistor static latch, or it can be a high-density cell. Yet, in case of high-density cells, two or three cells can be accommodated in the same area with their bit lines shared. Also, in case of dual or multiport memory, the cell architecture can be changed, but the basic configuration and approach remains the same. It will also be appreciated that the area overhead is only a maximum of 40% over a full custom design. This overhead can also be reduced if a high-density memory cell is used.

The following reference table provides a list of terms and acronyms used herein.

| Acronym | Definition |
| --- | --- |
| FF | Flip-Flop |
| ASIC | Application Specific Integrated Circuits |
| RAM | Random Access Memory |
| SRAM | Static RAM (a volatile memory) |
| BIT | A unit cell of the memory into which a unit of data can be written and which stores the same until the power is switched off, or new data is written thereto. |
| WORDS | Can be accessed by a particular address in a single operation cycle of the memory. |
| GLITCH | Unwanted pulses which can at times behave as invalid clocks and destroy the functionality of a synchronous system. |
| SKEW | The phase difference in the clocks going to two or more synchronous systems that are supposed to be synchronized by a single clock. |
| BIST | Built In Self Test. In the present context it means a memory BIST solution by default. |

That which is claimed is:

1. A method for designing a synchronous static random access memory (SRAM) comprising:
arranging a plurality of custom memory cells and semi-custom input/output/precharge circuitry to form a memory core;
connecting a semi-custom decoder to the memory core; and connecting semi-custom control clock generation circuitry to the semi-custom decoder and the semi-custom input/output/precharge circuitry.

2. The method of claim 1 wherein the custom memory cells and semi-custom input/output/precharge circuitry are in bit slice form.

3. The method of claim 1 wherein the custom memory cells are compatible with semi-custom synthesis tools and standard cell layout design rules.

4. The method of claim 1 wherein arranging comprises arranging the plurality of custom memory cells and the semi-custom input/output/precharge circuitry in a single column with common bit lines.

5. The method of claim 1 wherein the semi-custom decoder is synthesizable and has a register transfer level (RTL) model.

6. The method of claim 1 wherein the semi-custom decoder comprises at least one access buffer.

7. The method of claim 1 wherein the custom memory cells, the semi-custom decoder, the semi-custom input/output/precharge circuitry, and the semi-custom control clock generation circuitry are collectively and individually testable using register transfer level (RTL) models.

8. The method of claim 1 wherein the semi-custom decoder comprises a plurality of flip-flops connected to the plurality of custom memory cells.

9. The method of claim 8 further comprising connecting a common asynchronous preset/clear signal input to the plurality of flip-flops to provide simultaneous selection of all of the memory cells for writing common initialization values thereto.

10. The method of claim 9 wherein the plurality of flip-flops implement an asynchronous reset based upon the asynchronous preset/clear signal input.

11. The method of claim 8 wherein the plurality of flip-flops are driven by clock tree signals.

12. The method of claim 8 further comprising connecting a plurality of word lines between the plurality of flip-flops and the custom memory cells and connecting at least one scan input to the plurality of flip-flops, and wherein the plurality of flip-flops select multiple word lines simultaneously to provide synchronous initialization based upon the at least one scan input.

13. The method of claim 8 further comprising configuring the plurality of flip-flops to provide a checker board test pattern initialization based upon a test signal.

14. A method for designing a synchronous static random access memory (SRAM) comprising:
arranging a plurality of custom memory cells and semi-custom input/output/precharge circuitry in a single column with common bit lines to form a memory core;
connecting a semi-custom decoder to the memory core; and
connecting semi-custom control clock generation circuitry to the semi-custom decoder and the semi-custom input/output/precharge circuitry;
the custom memory cells, the semi-custom decoder, the semi-custom input/output/precharge circuitry, and the semi-custom control clock generation circuitry being collectively and individually testable using register transfer level (RTL) models.

15. The method of claim 14 wherein the custom memory cells and semi-custom input/output/precharge circuitry are in bit slice form.

16. The method of claim 14 wherein the semi-custom decoder is synthesizable and has a register transfer level (RTL) model.

17. The method of claim 14 wherein the semi-custom decoder comprises at least one access buffer.

18. The method of claim 14 wherein the semi-custom decoder comprises a plurality of flip-flops connected to the plurality of custom memory cells.

19. The method of claim 18 further comprising connecting a common asynchronous preset/clear signal input to the plurality of flip-flops to provide simultaneous selection of all of the memory cells for writing common initialization values thereto.

20. The method of claim 19 wherein the plurality of flip-flops implement an asynchronous reset based upon the asynchronous preset/clear signal input.

21. The method of claim 18 wherein the plurality of flip-flops are driven by clock tree signals.

22. The method of claim 18 further comprising connecting a plurality of word lines between the plurality of flip-flops and the custom memory cells and connecting at least one scan input to the plurality of flip-flops, and wherein the plurality of flip-flops select multiple word lines simultaneously to provide synchronous initialization based upon the at least one scan input.

23. The method of claim 18 further comprising configuring the plurality of flip-flops to provide a checker board test pattern initialization based upon a test signal.

24. A method for fabricating an integrated circuit comprising:
designing a synchronous SRAM architecture by
arranging a plurality of custom memory cells and semi-custom input/output/precharge circuitry to form a memory core,
connecting a semi-custom decoder to the memory core, and
connecting semi-custom control clock generation circuitry to the semi-custom decoder and the semi-custom input/output/precharge circuitry; and
fabricating the integrated circuit using the synchronous SRAM architecture.

25. The method of claim 24 wherein the custom memory cells and semi-custom input/output/precharge circuitry are in bit slice form.

26. The method of claim 24 wherein the custom memory cells are compatible with semi-custom synthesis tools and standard cell layout design rules.

27. The method of claim 24 wherein arranging comprises arranging the plurality of custom memory cells and the semi-custom input/output/precharge circuitry in a single column with common bit lines.

28. The method of claim 24 wherein the semi-custom decoder is synthesizable and has a register transfer level (RTL) model.

29. The method of claim 24 wherein the semi-custom decoder comprises at least one access buffer.

30. The method of claim 24 wherein the custom memory cells, the semi-custom decoder, the semi-custom input/output/precharge circuitry, and the semi-custom control clock generation circuitry are collectively and individually testable using register transfer level (RTL) models.

31. The method of claim 24 wherein the semi-custom decoder comprises a plurality of flip-flops connected to the plurality of custom memory cells.

32. The method of claim 31 further comprising connecting a common asynchronous preset/clear signal input to the plurality of flip-flops to provide simultaneous selection of all of the memory cells for writing common initialization values thereto.

33. The method of claim 32 wherein the plurality of flip-flops implement an asynchronous reset based upon the asynchronous preset/clear signal input.

34. The method of claim 31 wherein the plurality of flip-flops are driven by clock tree signals.

35. The method of claim 31 further comprising connecting a plurality of word lines between the plurality of flip-flops and the custom memory cells and connecting at least one scan input to the plurality of flip-flops, and wherein the plurality of flip-flops select multiple word lines simultaneously to provide synchronous initialization based upon the at least one scan input.

36. The method of claim 31 further comprising configuring the plurality of flip-flops to provide a checker board test pattern initialization based upon a test signal.

* * * * *